United States Patent
Kawamata et al.

(10) Patent No.: US 9,227,258 B2
(45) Date of Patent: Jan. 5, 2016

(54) LEAD-FREE SOLDER ALLOY HAVING REDUCED SHRINKAGE CAVITIES

(75) Inventors: Yuji Kawamata, Tokyo (JP); Minoru Ueshima, Tokyo (JP); Min Kang, Gyeonggi-do (KR); Kayako Nakagawa, Kobe (JP); Yasuaki Kokubu, Kurume (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 12/736,625

(22) PCT Filed: Apr. 23, 2009

(86) PCT No.: PCT/JP2009/058077
§ 371 (c)(1),
(2), (4) Date: May 3, 2011

(87) PCT Pub. No.: WO2009/131178
PCT Pub. Date: Oct. 29, 2009

(65) Prior Publication Data
US 2011/0204121 A1 Aug. 25, 2011

(30) Foreign Application Priority Data
Apr. 23, 2008 (JP) .................. 2008-112282

(51) Int. Cl.
| | |
|---|---|
| *B23K 35/22* | (2006.01) |
| *B23K 1/00* | (2006.01) |
| *B23K 1/20* | (2006.01) |
| *B23K 35/02* | (2006.01) |
| *B23K 35/26* | (2006.01) |
| *B23K 35/362* | (2006.01) |
| *C22C 13/02* | (2006.01) |
| *H01L 23/488* | (2006.01) |
| *H05K 3/34* | (2006.01) |
| *H01L 23/498* | (2006.01) |

(52) U.S. Cl.
CPC ............... *B23K 1/0016* (2013.01); *B23K 1/203* (2013.01); *B23K 35/0244* (2013.01); *B23K 35/262* (2013.01); *B23K 35/362* (2013.01); *C22C 13/02* (2013.01); *H01L 23/488* (2013.01); *H05K 3/3484* (2013.01); *B23K 2201/42* (2013.01); *H01L 23/49816* (2013.01); *H01L 2924/0002* (2013.01)

(58) Field of Classification Search
USPC ....................... 228/56.3; 148/23–24; 420/561
See application file for complete search history.

(56) References Cited

U.S. PATENT DOCUMENTS

| | | | | |
|---|---|---|---|---|
| 4,879,096 | A * | 11/1989 | Naton | 420/561 |
| 6,179,935 | B1 * | 1/2001 | Yamashita et al. | 148/400 |
| 6,365,097 | B1 | 4/2002 | Yamashita et al. | 420/561 |

(Continued)

FOREIGN PATENT DOCUMENTS

| | | |
|---|---|---|
| CN | 1460572 | 12/2003 |
| EP | 0336575 | 10/1989 |
| EP | 0976489 | 2/2000 |

(Continued)

*Primary Examiner* — Devang R Patel
(74) *Attorney, Agent, or Firm* — Michael Tobias

(57) ABSTRACT

A lead-free solder alloy having improved surface properties which suppresses minute irregularities and shrinkage cavities has a composition consisting essentially of Ag: 0.1-1.5%, Bi: 2.5-5.0%, Cu: 0.5-1.0%, optionally Ni: 0.015-0.035% and/or at least one of Ge and Ga: 0.0005-0.01%, and a remainder of Sn and unavoidable impurities.

14 Claims, 1 Drawing Sheet

(56) References Cited

U.S. PATENT DOCUMENTS

2002/0009384 A1* 1/2002 Habu et al. .................... 420/557
2008/0292492 A1* 11/2008 Ingham et al. ................ 420/561

FOREIGN PATENT DOCUMENTS

| | | |
|---|---|---|
| EP | 0988920 | 3/2000 |
| EP | 1048392 | 11/2000 |
| EP | 1275463 | 1/2003 |
| JP | 270033 | 3/1990 |
| JP | 8132277 | 5/1996 |
| JP | 200015476 | 1/2000 |
| JP | 2000015476 A * | 1/2000 |
| JP | 2001025891 | 1/2001 |
| JP | 200220807 | 1/2002 |
| JP | 2002011593 | 1/2002 |
| JP | 200296191 | 4/2002 |
| JP | 20031481 | 1/2003 |
| JP | 2005186160 | 7/2005 |

* cited by examiner

LEAD-FREE SOLDER ALLOY HAVING REDUCED SHRINKAGE CAVITIES

TECHNICAL FIELD

This invention relates to a lead-free solder alloy having reduced shrinkage cavities and a solder paste and a soldering method using this solder alloy.

BACKGROUND ART

The most commonly used lead-free solders at the present time are Sn—Ag—Cu based solder alloys. Sn—Ag—Cu based lead-free solders have excellent heat cycle properties, and they have good wettability among lead-free solders. In addition, like conventional Sn—Pb based solders, they can be formed into any shape. However, as is the case with Sn—Ag based lead-free solders, Sn—Ag—Cu based lead-free solders develop a rough surface (minute irregularities) due to non-uniform solidification, resulting in the surface with almost no luster, and they sometimes develop solidification defects called shrinkage cavities which look like cracks. These phenomena are caused by the growth of dendriform crystals (dendrites) caused by the formation of hypereutectic Sn—Ag.

With Sn—Ag based lead-free solders or Sn—Ag—Cu based lead-free solders, when molten solder solidifies, dendrites of Sn precipitate first as primary crystals, and then a Sn—Ag or a Sn—Ag—Cu eutectic phase solidifies. Due to volumetric shrinkage which takes place at this time, minute irregularities or shrinkage cavities develop in the solder surface. When observed in detail, it can be seen that the shrinkage cavities develop along dendrites.

Thus, shrinkage cavities are formed by solidification cracking which occurs along the grain boundaries of dendrites, and they extend no further than the surface of solder. Therefore, shrinkage cavities are thought that they do not induce cracking by becoming the starting points of cracks and hence do not impair the reliability of soldering. However, it is difficult to distinguish shrinkage cavities from cracks by external observation, so depending on the size of shrinkage cavities, it is not possible to eliminate the possibility of their affecting the reliability of soldering. Therefore, as stated below, the occurrence of shrinkage cavities is now seen as a problem.

As the soldering interspace (spacing between portions to be soldered) becomes finer and finer, it becomes increasingly difficult for an inspector to distinguish between shrinkage cavities and cracks by visual observation of solder. In some cases, it is not possible to make a determination without using extremely expensive equipment such as an electron microscope. However, there is a limit on the size of a sample which can be observed with an electron microscope, and the time required for observation is at least several hundred times that required for usual equipment for inspecting external appearance. Therefore, it is impossible to use an electron microscope to inspect every solder portions.

In the case of soldering by the reflow method using a solder paste, as the soldering interspace becomes smaller, the printed thickness of solder paste may become as small as around 50 µm. With a printed thickness of this level, the thickness of soldered joints (solder fillets) which are formed after reflow soldering becomes around 25 µm, and the amount of solder in each soldered joint becomes small. If a shrinkage cavity having a depth of around 10 µm develops in such a thin soldered joint, the thickness of the soldered joint locally becomes as thin as around 10 µm, and there is a possibility of the thinness of the soldered joint having an adverse effect on the reliability of soldering.

When performing mounting on a printed circuit board using a solder paste, which is the form in which solder is typically supplied in the reflow soldering method, the solder paste is applied to prescribed locations of a printed circuit board by printing and then subjected to reflow to form soldering portions on the printed circuit board. The printed circuit board is then inspected by an optical method such as image recognition to ascertain the soldered condition of the soldering portions. Optical inspection equipment which is currently sold for lead-free solder is designed to be able to recognize solder having a low luster. However, minute irregularities and shrinkage cavities which develop in the surface of a Sn—Ag based lead-free solder or a Sn—Ag—Cu based lead-free solder are not caused solely by the solder composition, but they vary in extent in accordance with external factors such as the soldering conditions and the cooling conditions. As a result, it is difficult to determine an average value of brightness intensity, and inspection errors can easily take place.

The present applicant disclosed a lead-free solder ball which has a composition of Sn—4.0 to 6.0 mass % Ag—1.0 to 2.0 mass % Cu and which has good surface properties and suppresses the occurrence of minute irregularities and shrinkage cavities in the solder surface (below-identified Patent Document 1). In addition, the applicant disclosed a method of preventing the occurrence of shrinkage cavities in soldered joints during soldering by the flow soldering method using a Sn—Ag—Cu based lead-free solder alloy by carrying out soldering while controlling a solder bath so as to have an Ag concentration of greater than 3.8 mass % to at most 4.2 mass % and a Cu concentration of 0.8-1.2 mass % (below-identified Patent Document 2).

These patent documents are intended to reduce the occurrence of minute irregularities and shrinkage cavities in the solder surface by adding a larger amount of Ag and Cu compared to a Sn-3.5Ag-0.7Cu and Sn-3.0Ag-0.5Cu composition which are currently widely used as lead-free solder alloys. Namely, by increasing the content of Ag and Cu and correspondingly decreasing the Sn content, the formation of Sn dendrites is decreased and the occurrence of surface irregularities and shrinkage cavities is suppressed. However, increasing the content of Ag which is expensive causes material costs to become high. In addition, increasing the content of Ag and Cu causes the melting temperature (particularly the liquidus temperature) of solder to become high and makes it difficult to use the solder for reflow soldering.

Patent Document 1: JP 2003-1481 A
Patent Document 2: JP 2005-186160 A

SUMMARY OF THE INVENTION

An object of the present invention is to provide a Sn—Ag—Cu based lead-free solder alloy which suppresses the occurrence of minute irregularities and shrinkage cavities in the solder surface without worsening the resistance of the solder to heat cycles.

Another object of the present invention is to suppress the occurrence of minute irregularities and shrinkage cavities in the surface of a lead-free solder by means of a lead-free solder alloy in which the content of expensive Ag is not increased and which has nearly the same liquidus temperature as conventional Sn—Ag—Cu based solders.

The present inventors found that reducing the content of Ag in a Sn—Ag—Cu based lead-free solder decreases the occurrence of minute irregularities and shrinkage cavities in the solder surface and that adding Bi in place of the reduced Ag also decreases the occurrence of minute irregularities and shrinkage cavities in the solder surface without adversely affecting the resistance to heat cycles, whereby the above-described objects can be achieved.

Namely, shrinkage cavities can be suppressed by greatly suppressing the amount of formation of the Sn—Ag—Cu eutectic phase instead of by decreasing the amount of formation of dendrites caused by a decrease in the Sn content as proposed in above-described Patent Documents 1 and 2. For this purpose, it is effective to decrease the Ag content to at most 1.5 mass %. However, decreasing the Ag content is accompanied by a decrease in the strength of the solder, which causes the resistance to thermal fatigue (resistance to heat cycles) of soldered joints to decrease. Therefore, even if shrinkage cavities can be suppressed, the reliability of soldered joints decreases. However, a deliberate addition of Bi, which is generally thought to be brittle and to decrease the reliability of solder, makes it possible to obtain a lead-free solder alloy having resistance to thermal fatigue which is the same as or better than that of Sn-3Ag-0.5Cu solder. The addition of Bi does not have an effect on the formation of shrinkage cavities, and it can decrease the formation of voids in soldered joints.

The present invention is a lead-free solder alloy having a composition consisting essentially of, in mass %, Ag: 0.1-1.5%, Bi: 2.5-5.0%, Cu: 0.5-1.0%, Ni: 0-0.035%, one or both of Ge and Ga: 0-0.01%, and a remainder of Sn and unavoidable impurities.

Ni, Ge, and Ga are optional alloying elements. Ni is preferably added in an amount of 0.015-0.035 mass % in order to achieve the below-described object of addition of this element. Similarly, when adding one or both of Ge and Ga, the content is preferably in the range of 0.0005-0.01 mass %.

The present invention also provides a lead-free solder paste comprising a mixture of a powder of the above-described solder alloy and a flux and a method of soldering a printed circuit board by the reflow soldering method characterized by using this solder paste.

The present invention also provides a soldered joint formed from the above-described lead-free solder alloy and a solder ball formed from the above-described lead-free solder alloy.

With a lead-free solder alloy according to the present invention, the occurrence of shrinkage cavities is suppressed by decreasing the Ag content and increasing the content of Sn which forms dendrites compared to a typical Sn—Ag—Cu based lead-free solder. This result is conjectured to occur because bonding between Sn dendrites is promoted, which makes it difficult for solidification cracking to occur. However, decreasing the Ag content has an adverse effect on the excellent resistance to heat cycles of a Sn—Ag—Cu based lead-free solder.

It was found that Bi can be added to a Sn—Ag—Cu based lead-free solder as a strengthening element. Along with In and Zn, Bi is a metal which is well-known as an element which can be added to lower the melting temperature of a lead-free solder. In elemental form, Bi is a hard and brittle metal, and if Bi is added to a lead-free solder, there is a tendency for the solder to become hard and have a decreased elongation. However, it was found that when the amount of Bi added to a Sn—Ag—Cu based lead-free solder is in the range of 2.5-5.0 mass %, although the elongation of the solder alloy decreases to a small extent, its resistance to thermal fatigue increases due to an increase in strength. As a result of adding Bi, even if the Ag content is decreased to 1.5 mass % or below, the resistance to heat cycles is improved to a level close to that of a Sn-3.5Ag-0.7Cu or a Sn-3.0Ag-0.5Cu alloy.

A Sn—Bi—Ag—Cu based lead-free solder according to the present invention has excellent resistance to heat cycles, and it markedly suppresses the occurrence of minute irregularities and shrinkage cavities in the solder surface which are a drawback of conventional Sn—Ag—Cu lead-free solders. In addition, the addition of Bi suppresses the occurrence of voids and makes it possible to form highly reliable soldered joints having stable quality.

A solder alloy according to the present invention can be used in any of the known forms in which solder is used. For example, it is suitable for use in the reflow soldering method in the form of a solder paste formed by mixing a solder alloy powder and a flux which is much used in mounting of printed circuit boards. In addition, it can be used in the form of solder balls in the reflow soldering method.

Compared to a typical Sn-3Ag-0.5Cu or Sn-3.5Ag-0.75Cu solder alloy, a solder alloy according to the present invention has a somewhat higher liquidus temperature. However, the difference is only a few degrees C., so the solder can be adequately utilized for flow soldering. Furthermore, it has ductility which is adequate for a solder alloy and can be subjected to drawing, which is impossible with a typical Bi-containing solder. Therefore, it can also be used in the form of bar solder, wire solder, and rosin core solder. In addition, it can be used in the form of a solder preform.

EMBODIMENTS OF THE INVENTION

Figure 1:
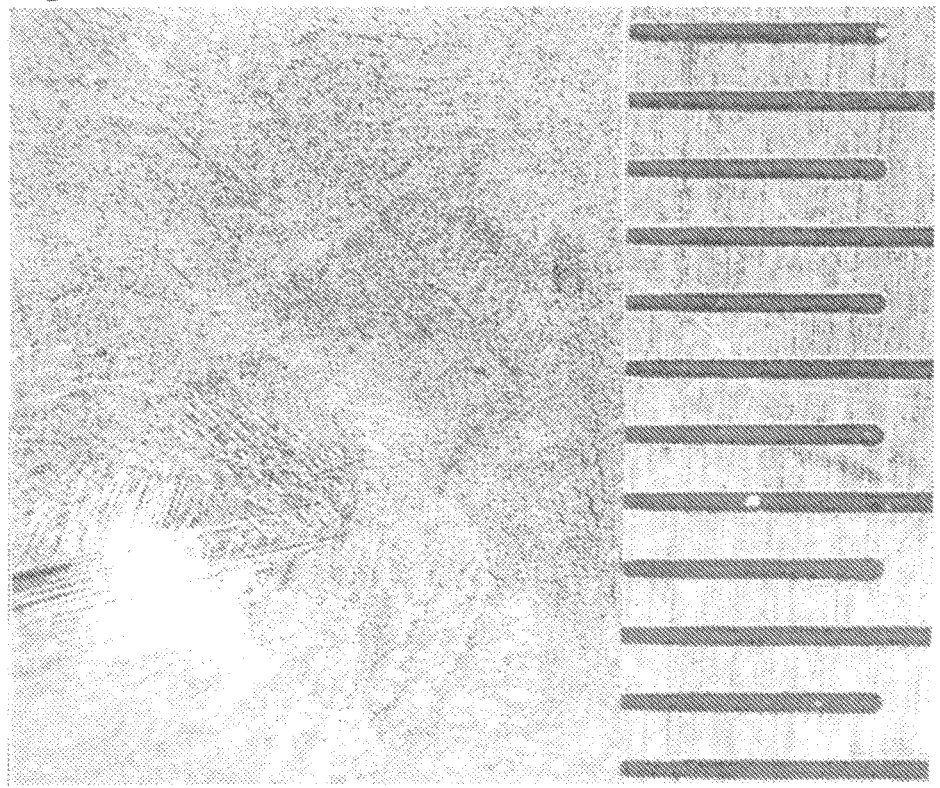
FIG. 1 is a photomicrograph showing the solder surface in an example in which the length of shrinkage cavities is at most 0.5 mm. One division on the scale on the right side is 0.5 mm.

Below, the present invention will be explained in greater detail. In the following explanation, % with respect to a solder alloy composition means mass % unless otherwise indicated.

A Sn—Bi—Ag—Cu based solder alloy according to the present invention has a decreased Ag content and an increased Sn content, thereby promoting the bonding of Sn dendrites to each other and reducing the occurrence of minute irregularities and shrinkage cavities in the solder surface. A resulting decrease in resistance to thermal fatigue of a soldered joint is prevented by the addition of a prescribed amount of Bi. If only Bi is added to Sn, it is difficult to maintain the resistance to thermal fatigue of solder. Unless Ag and Cu, which are metal elements which form intermetallic compounds with Sn, are added, the resistance to thermal fatigue (resistance to heat cycles) of a solder worsens.

The content of Ag is 0.1-1.5%. If the Ag content exceeds 1.5%, a large amount of minute irregularities and shrinkage cavities develop in the solder surface. If the Ag content is less than 0.1%, the resistance to heat cycles of the solder cannot be improved even if Bi is added. A preferred Ag content is 0.3-1.0%.

The content of Cu is 0.5-1.0%. At least 0.5% of Cu is added in order to maintain the resistance to heat cycles of the solder. In the present invention, because the Ag content is limited to at most 1.5% in order to suppress the occurrence of shrinkage cavities, resistance to heat cycles deteriorates if the Cu content is less than 0.5%, even if Bi is added in an amount of 2.5% or more. If the Cu content exceeds 1.0%, the liquidus temperature of the solder alloy increases such that at usual reflow temperatures, the solder does not completely melt, a large amount of voids are formed, and as a result, resistance to heat cycles becomes poor. A preferred Cu content is 0.6-0.9%.

The content of Bi is in the range of 2.5-5.0%. In a lead-free solder alloy according to the present invention in which the Ag content is limited to at most 1.5%, resistance to heat cycles decreases if the Bi content is smaller than 2.5%. If the Bi content exceeds 5.0%, crystallization of Bi in soldered joints increases, and resistance to heat cycles once again decreases. The Bi content is preferably 3-4.5%.

A Sn—Bi—Ag—Cu based solder alloy according to the present invention may contain Ni in an amount of 0.015-0.035% in order to prevent Cu or Ni electrodes from dissolving into the solder. The addition of such a minute amount of Ni produces almost no increase in the melting temperature of the solder alloy, and it also does not produce problems such as an increase in voids after soldering.

In order to improve wettability, 0.0005-0.01% of Ge and/or Ga (the total amount when both elements are added) may be added to a Sn—Bi—Ag—Cu based solder alloy according to the present invention. The addition of these elements suppresses the formation of voids after soldering. If this amount exceeds 0.01%, the surface tension of the molten solder increases and the formation of voids in soldered joints increases.

A Sn—Bi—Ag—Cu based solder alloy according to the present invention may contain one or more other alloying elements in a total amount of at most 0.05%, preferably at most 0.01%, and still more preferably in a minute amount of at most 0.005%. The remainder of this lead-free solder is Sn and unavoidable impurities.

The Sn content is preferably at least 93% and at most 96.5%, and more preferably at least 94% and at most 96%.

As previously stated, a lead-free solder alloy according to the present invention can be used in various forms, including as solder balls or as a solder paste, for example.

A solder paste is a paste formed by mixing a solder powder with a small amount of a flux. A solder paste is widely used for mounting electronic parts on printed circuit boards by the reflow soldering method. A flux used in a solder paste may be either a water soluble flux or a non-water soluble flux, but typically, it is a rosin flux, which is a rosin-based non-water soluble flux containing a suitable activator, solvent, and thixotropic agent.

Solder balls are spheres of solder typically having a diameter of around 0.05-1.0 mm. They are used for forming electrodes on semiconductor packages such as BGA's (ball grid arrays) or bumps on substrates. As described in above-mentioned Patent Document 1, various methods of manufacturing solder balls, such as the oil bath method, are known. When solder balls are being distributed on a wafer or substrates, they sometimes undergo a procedure in which they are arranged by being rolled on top of a pallet and inserted into holes in the pallet. Therefore, it is necessary that solder balls be completely spherical. Because solder balls mounted on wafers or substrates are inspected by optical recognition, their surface must not have damaged portions or discoloration. Solder balls formed from a lead-free solder alloy according to the present invention have reduced formation of minute irregularities and shrinkage cavities in their surface, so they have an excellent surface properties.

Soldering of a printed circuit board using a lead-free solder alloy according to the present invention can be carried out using either the flow soldering method or the reflow soldering method. Either method can be carried out in a conventional manner. Soldering is normally carried out at a temperature from a few degrees C. to around 20° C. higher than the solidus temperature of the solder alloy used. A solder alloy according to the present invention typically has a solidus temperature in the range of 188-203° C. and a liquidus temperature in the range of 219-223° C., and it can be soldered in the same manner and using the same soldering conditions as a typical Sn-3Ag-0.5Cu lead-free solder.

A soldered joint which is formed in this manner has diminished minute surface irregularities, and in particular, the occurrence of shrinkage cavities is markedly suppressed. Therefore, it is easy to distinguish cracks by visual inspection, and inspection by an optical inspection apparatus utilizing image recognition can be carried out more smoothly.

Example 1

Solder alloys having the composition shown in Table 1 were prepared and the below-described tests were carried out thereon. The test results are shown in Table 1.

TABLE 1

| | | Alloy composition (%) | | | | | Melting temp. (° C.) | | Bonding strength (N) | | Voids | Shrinkage cavities |
|---|---|---|---|---|---|---|---|---|---|---|---|---|
| | | Sn | Ag | Cu | Bi | Ni | Solidus | Liquidus | Avg | Min | (number) | (mm) |
| Examples | 1 | rem | 0.3 | 0.7 | 2.5 | | 203 | 223 | 38 | 22 | 11 | 0.3 |
| | 2 | rem | 0.3 | 0.5 | 4.0 | | 194 | 222 | 52 | 24 | 12 | 0.5 |
| | 3 | rem | 0.3 | 1.0 | 5.0 | | 188 | 222 | 60 | 21 | 10 | 0.6 |
| | 4 | rem | 1.0 | 0.7 | 2.5 | | 202 | 222 | 35 | 24 | 20 | 0.5 |
| | 5 | rem | 1.0 | 0.7 | 4.0 | 0.015 | 197 | 219 | 56 | 28 | 15 | 0.6 |
| | 6 | rem | 1.0 | 1.0 | 5.0 | | 188 | 223 | 65 | 24 | 18 | 0.6 |
| | 7 | rem | 1.5 | 0.9 | 2.5 | | 202 | 220 | 41 | 22 | 22 | 0.8 |
| | 8 | rem | 1.5 | 0.5 | 3.0 | | 200 | 220 | 52 | 25 | 23 | 0.7 |
| | 9 | rem | 1.5 | 1.0 | 5.0 | 0.035 | 189 | 222 | 49 | 22 | 18 | 0.8 |
| Comparative Examples | 1 | rem | 0.0 | 0.5 | 0.0 | | 227 | 229 | 15 | 5 | 44 | 0.2 |
| | 2 | rem | 0.3 | 0.7 | 0.0 | | 217 | 226 | 21 | 8 | 32 | 0.2 |
| | 3 | rem | 1.0 | 0.7 | 0.0 | | 217 | 224 | 25 | 8 | 28 | 0.4 |
| | 4 | rem | 1.5 | 0.7 | 0.0 | | 211 | 223 | 24 | 10 | 30 | 0.7 |
| | 5 | rem | 0.0 | 1.0 | 2.0 | | 213 | 225 | 25 | 12 | 22 | 0.3 |
| | 6 | rem | 1.5 | 0.5 | 1.0 | | 211 | 223 | 29 | 13 | 28 | 0.8 |
| | 7 | rem | 1.0 | 0.7 | 6.0 | | 184 | 217 | 58 | 16 | 12 | 0.8 |
| | 8 | rem | 0.0 | 1.1 | 6.0 | | 194 | 220 | 60 | 15 | 10 | 0.2 |
| | 9 | rem | 1.5 | 0.5 | 6.0 | | 183 | 215 | 55 | 12 | 5 | 0.7 |
| | 10 | rem | 3.0 | 0.5 | 0.0 | | 217 | 220 | 27 | 18 | 45 | 7.5 |
| | 11 | rem | 0.3 | 0.7 | 2.0 | | 205 | 223 | 33 | 15 | 22 | 0.3 |

TABLE 1-continued

| | Alloy composition (%) | | | | | Melting temp. (° C.) | | Bonding strength (N) | | Voids | Shrinkage cavities |
|---|---|---|---|---|---|---|---|---|---|---|---|
| | Sn | Ag | Cu | Bi | Ni | Solidus | Liquidus | Avg | Min | (number) | (mm) |
| 12 | rem | 1.0 | 0.7 | 2.0 | | 207 | 222 | 29 | 16 | 23 | 0.5 |
| 13 | rem | 1.5 | 0.9 | 2.0 | | 205 | 220 | 36 | 14 | 24 | 0.8 |
| 14 | rem | 0.2 | 0.2 | 3.8 | | 195 | 225 | 43 | 15 | 12 | 0.5 |
| 15 | rem | 2.0 | 0.5 | 2.0 | | 205 | 219 | 29 | 16 | 30 | 5.9 |
| 16 | rem | 3.7 | 0.2 | 10.8 | | 163 | 204 | 56 | 4 | 22 | 7.6 |
| 17 | rem | 1.5 | 1.0 | 5.0 | 0.050 | 189 | 255 | 46 | 22 | 25 | 0.8 |
| 18 | rem | 1.5 | 1.2 | 5.0 | | 189 | 250 | 46 | 22 | 28 | 0.7 |
| 19 | rem | 0.3 | 0.4 | 2.5 | | 206 | 224 | 29 | 16 | 16 | 0.4 |
| 20 | rem | 0 | 0.3 | 5.0 | | 199 | 220 | 50 | 18 | 9 | 0.5 |

Test Methods

1) Measurement of the Melting Point Using a DSC

A sample in an amount of 10-40 mg was collected, and its solidus temperature and liquidus temperature were measured using a differential scanning calorimeter (DSC) at a rate of temperature increase of 5° C. per minute.

2) Bonding Strength after Heat Cycles

Chip resistors measuring 3.2×1.6×0.6 mm were soldered to portions to be soldered (1.6×1.2 mm) arranged in a prescribed pattern on a 6-layer printed circuit board having a thickness of 1.6 mm. Soldering was carried out by the reflow soldering method in which a solder paste prepared from a powder of each solder alloy to be tested and a rosin flux was applied by printing to a thickness of 150 μm to the portions to be soldered of a printed circuit board and then heated in a reflow furnace with a peak temperature of 245° C.

The printed circuit board having the same chip resistors mounted on all the portions to be soldered were subjected to 1,000 heat cycles, each cycle comprising holding at −55° C. and +125° C. for 30 minutes at each temperature to obtain test samples (soldered chip resistors which had been exposed to heat cycles). The test samples were peeled off by applying a lateral force in a bonding strength tester, and the strength in newtons (N) required for peeling was measured. Twenty chip resistors (test samples) were used in this measurement for each solder alloy. The average value and the minimum (lowest) value of the bonding strength which was obtained are shown in Table 1.

3) Occurrence of Voids

Ten solder fillets of the remaining chip resistors on each printed circuit board which underwent the above-described heat cycle test were observed with a transmission x-ray microscope at a magnification of 15 times, and the total number of voids having a diameter of at least 300 μm was counted. However, voids beneath the chip resistors were ignored.

4) Shrinkage Cavities

A copper plate measuring 14×18×0.3 mm was coated with a solder resist except for a portion at the center with a diameter of 10 mm where Cu was exposed. One gram of a solder alloy to be tested was placed on the portion of the copper plate where Cu was exposed and then a rosin flux was applied to the solder alloy. The copper plate was placed atop a copper substrate measuring 20×20×0.3 mm which was floated on the surface of a solder bath maintained at 270° C., and it was left as it was for 30 seconds to melt the solder alloy. The copper plate was then removed from the bath and cooled in air.

The surface of a region measuring 25 mm² at the center of the solidified solder was observed with a stereo microscope at a magnification of 50 times. The overall extended length of shrinkage cavities measuring at least 20 μm in width and at least 200 μm long was measured 3 times, and the average value thereof was made the length of shrinkage cavities. A solder for which the length of shrinkage cavities measured by this test was at most 1 mm is considered to have no problems in actual use.

Results of Measurement

1) Melting Point

All of the solder alloys according to the present invention has a liquidus temperature of 230° C. or lower and a solidus temperature of 170° C. or higher. Taking into consideration thermal effects on electronic parts and printed circuit boards, the liquidus temperature of solder is preferably 230° C. or lower. In order not to reduce the bonding strength at high temperatures, the solidus temperature of solder is preferably at least 170° C. Accordingly, a solder alloy according to the present invention has melting properties suitable for soldering of electronic parts to printed circuit boards.

2) Bonding Strength after Heat Cycles

A lead-free solder alloy according to the present invention has an average value of the bonding strength after a heat cycle test of at least 30 N and a minimum value of at least 20 N.

During a heat cycle test, the bonding strength decreases primarily due to the formation of cracks. The more severe is the propagation of cracks, the lower is the bonding strength. In this heat cycle test, if cracks completely pass through a soldered joint, the bonding strength becomes 10 N or lower. Therefore, it is thought that a sufficient bonded state is maintained if the average value of the bonding strength is at least 20 N and the minimum value is at least 15 N after 1,000 heat cycles. However, some common mounting substrates require even higher resistance to thermal fatigue. Taking into consideration that the average value and the minimum value of the bonding strength after the heat cycle test for 1,000 cycles of a Sn-3Ag-0.5Cu alloy (Comparative Example 10 in Table 1) were 27 N and 18 N, respectively, an average value of at least 30 N and a minimum value of 20 N for the bonding strength after heat cycles were considered acceptable in order to obtain a resistance to thermal fatigue which is comparable to or better than that of a Sn-3Ag-0.5Cu alloy. All of the examples of solder alloys according to the present invention were acceptable.

3) Void Formation

The Sn-3Ag-0.5Cu alloy had 45 voids. The Sn-1Ag-0.7Cu alloy and the Sn-0.3Ag-0.7Cu alloy, which are alloys developed with the object of decreasing voids, each had around 30 voids. Accordingly, it is considered that the effect of decreasing voids was sufficient if an alloy had at most 25 voids. The lead-free solder alloys according to the present invention exhibited results which were completely satisfactory with respect to void formation.

4) Shrinkage Cavity Test

Figure 2:
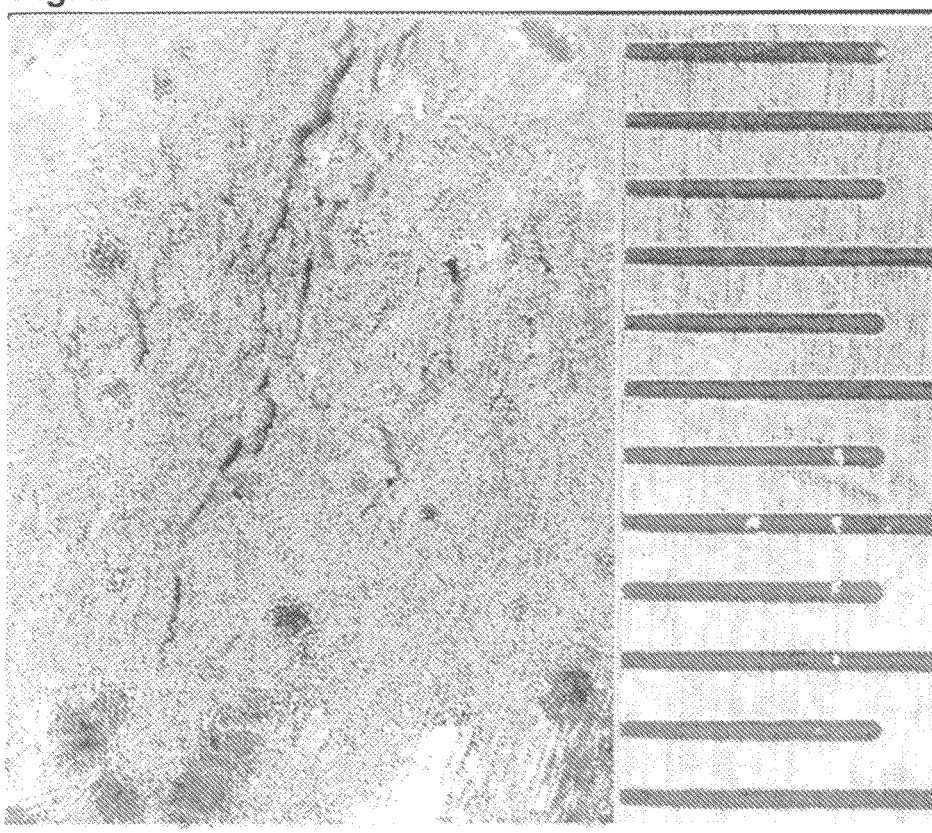
FIG. 2 is a photomicrograph showing the solder surface for which the length of shrinkage cavities exceeds 0.5 mm. One division on the scale represents the same length as in FIG. 1.

FIG. 1 shows the surface of a solder alloy according to the present invention in a shrinkage cavity test, and FIG. 2 shows the surface of a comparative example of a solder alloy in which the length of shrinkage cavities was large. With the solder alloy of FIG. 1, the surface was nearly smooth and shrinkage cavities had an extremely small width. In contrast, the comparative example of a solder alloy shown in FIG. 2 had a rougher surface, and depressions which looked like large cracks developed. These depressions were shrinkage cavities. As stated above, if the length of a shrinkage cavity is at most 1 mm, the shrinkage cavity does not cause any problems in actual use. The solder alloys according to the present invention were all satisfactory with respect to the length of shrinkage cavities. Thus, they exhibited marked improvements compared to a conventional Sn—Ag—Cu solder with respect to shrinkage cavities and minute irregularities in their surface.

A Sn—Bi—Ag—Cu lead-free solder alloy according to the present invention has a small difference between its solidus temperature and liquidus temperature, and the proportion of molten alloy at 220° C. exceeds 50%. Therefore, it can be used under the same reflow soldering conditions (peak temperature of 218° C.) as employed for Sn-3.0Ag-0.5Cu solder which is now commonly used, and it can be used as a substitute for this solder. Currently-used electronic parts to be soldered with lead-free solders are designed to have heat resistance premised on use of Sn-3.0Ag-0.5Cu solder. Therefore, a solder alloy according to the present invention can be used for soldering currently-used electronic parts without modifying the design thereof.

In addition, the good results of a lead-free solder alloy according to the present invention with respect to shrinkage cavities, resistance to heat cycles, and void formation show that the solder has high reliability.

The invention claimed is:

1. A soldering method comprising applying a solder paste to a printed circuit board, placing a surface mounted electronic part on the solder paste, and carrying out reflow soldering of the solder paste to form a soldered joint which connects the electronic part to the printed circuit board, the solder paste containing a lead-free solder alloy which consists of, in mass %, Ag: 0.3 - 1.5%, Bi: 3.5 - 5%, Cu: 0.5 - 1.0%, Ni: 0.015 - 0.035%, and a remainder of Sn and unavoidable impurities and which has a bonding strength of at least 20 N after 1000 heat cycles from -55° C. to +125° C. for 30 minutes at each temperature.

2. A soldered joint which is formed by applying a solder paste to a printed circuit board, placing a surface mounted electronic part on the solder paste, and carrying out reflow soldering of the solder paste to connect the electronic part to the printed circuit board, the soldered joint being made of a lead-free solder alloy which consists of, in mass %, Ag: 0.3 - 1.5%, Bi: 3.5 - 5%, Cu: 0.5 - 1.0%, Ni: 0.015 - 0.035%, and a remainder of Sn and unavoidable impurities and which has a bonding strength of at least 20 N after 1000 heat cycles from -55° C. to +125° C. for 30 minutes at each temperature.

3. A soldered joint as claimed in claim 2 wherein the solder alloy contains greater than 1.0% to at most 1.5% of Ag.

4. A soldered joint as claimed in claim 2 wherein the solder alloy contains 3.5 - 4.5% of Bi.

5. A soldered joint as claimed in claim 2 wherein the solder alloy contains 0.6 - 0.9% of Cu.

6. A soldered joint as claimed in claim 2 wherein the solder alloy contains 4 - 4.5% of Bi.

7. A method as claimed in claim 1 wherein the solder alloy contains 3.5 - 4.5% of Bi.

8. A method as claimed in claim 1 wherein the solder alloy contains 4 - 4.5% of Bi.

9. A soldered joint as claimed in claim 4 wherein the solder alloy contains greater than 1.0% to at most 1.5% of Ag.

10. A method as claimed in claim 7 wherein the solder alloy contains greater than 1.0% to at most 1.5% of Ag.

11. A soldered joint as claimed in claim 2 wherein the solder alloy has no shrinkage cavities longer than 1 mm in a shrinkage cavity test.

12. A soldered joint as claimed in claim 11 wherein in the shrinkage cavity test, the solder alloy is placed on a circular region of a copper plate measuring 10 mm in diameter and exposed to 270° C. for 30 seconds to melt the solder alloy and then cooled in air to solidify the solder alloy, and the length of shrinkage cavities on the surface of the solidified solder alloy is measured in a region measuring 25 mm$^2$ at the center of the solidified solder alloy.

13. A method as claimed in claim 1 wherein the solder alloy has no shrinkage cavities longer than 1 mm in a shrinkage cavity test.

14. A method as claimed in claim 13 wherein in the shrinkage cavity test, the solder alloy is placed on a circular region of a copper plate measuring 10 mm in diameter and exposed to 270° C. for 30 seconds to melt the solder alloy and then cooled in air to solidify the solder alloy, and the length of shrinkage cavities on the surface of the solidified solder alloy is measured in a region measuring 25 mm$^2$ at the center of the solidified solder alloy.

* * * * *